(12) United States Patent
Van Der Wilk

(10) Patent No.: US 11,443,912 B2
(45) Date of Patent: *Sep. 13, 2022

(54) HIGH VOLTAGE VACUUM FEEDTHROUGH

(71) Applicant: ASML Netherlands B.V., Veldhoven (NL)

(72) Inventor: Ronald Van Der Wilk, Knegsel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/140,699

(22) Filed: Jan. 4, 2021

(65) Prior Publication Data
US 2021/0175041 A1 Jun. 10, 2021

Related U.S. Application Data

(63) Continuation of application No. 16/703,729, filed on Dec. 4, 2019, now Pat. No. 10,886,093.

(30) Foreign Application Priority Data

Dec. 5, 2018 (EP) .................................. 18210534

(51) Int. Cl.
*H01J 5/46* (2006.01)
*C03C 27/04* (2006.01)
(Continued)

(52) U.S. Cl.
CPC .............. *H01J 5/46* (2013.01); *C03C 27/048* (2013.01); *H01J 5/36* (2013.01); *H01J 9/28* (2013.01)

(58) Field of Classification Search
CPC ........ H01J 5/46; H01J 5/36; H01J 5/34; H01J 5/32; H01J 5/48; H01J 5/50; H01J 37/248; H01J 23/14; C03C 27/048
See application file for complete search history.

(56) References Cited

U.S. PATENT DOCUMENTS 2,219,613 A ‡ 10/1940 Berghaus et al. ...... B60K 11/06
174/31 R
3,226,467 A ‡ 12/1965 Kienel ..................... B01J 3/006
174/18

(Continued)

FOREIGN PATENT DOCUMENTS

CN        105374475        11/2018
CN        105374475 B   ‡  11/2018

(Continued)

OTHER PUBLICATIONS

International Search Report issued by the International Searching Authority in related PCT Application No. PCT/EP2019/081710, dated Mar. 5, 2020 (5 pgs.).‡

(Continued)

*Primary Examiner* — Anne M Hines
*Assistant Examiner* — Jose M Diaz
(74) *Attorney, Agent, or Firm* — Finnegan, Henderson, Farabow, Garrett & Dunner, LLP

(57) ABSTRACT

A feedthrough for providing an electrical connection is provided. The feedthrough comprises a conductor and a quartz or a glass structure configured to surround at least a portion of the conductor and provide isolation to the conductor. The conductor and the quartz or glass structure may be coaxially arranged. The feedthrough can provide an electrical connection between an inside and outside of a vacuum chamber that contains a sample.

21 Claims, 10 Drawing Sheets

(51) Int. Cl.
*H01J 5/36* (2006.01)
*H01J 9/28* (2006.01)

(56) References Cited

U.S. PATENT DOCUMENTS

| | | | | |
|---|---|---|---|---|
| 4,282,395 | A | ‡ 8/1981 | Hagemann | C03C 8/24 403/29 |
| 4,459,430 | A | ‡ 7/1984 | Vanecek | H01B 17/26 174/142 |
| 4,544,845 | A | ‡ 10/1985 | Michel | H01J 37/073 250/423 F |
| 4,668,204 | A | ‡ 5/1987 | English | H01J 9/323 65/42 |
| 5,325,021 | A | ‡ 6/1994 | Duckworth | H01J 49/105 315/176 |
| 10,886,093 | B2 * | 1/2021 | Van Der Wilk | H01J 37/248 |
| 2012/0244290 | A1 ‡ | 9/2012 | Mullin | C23C 14/541 427/457 |
| 2018/0035489 | A1 * | 2/2018 | Spalding, Jr | H05B 3/34 |
| 2018/0054856 | A1 | 2/2018 | Grob et al. | |

FOREIGN PATENT DOCUMENTS

| | | |
|---|---|---|
| JP | S55021898 A | 2/1980 |
| JP | S61002255 A | 1/1986 |
| JP | H08510864 A | 11/1996 |
| JP | 2006313651 A | 11/2006 |
| JP | 2008053007 A | 3/2008 |
| WO | WO 2018/121969 A1 ‡ | 7/2018 |

OTHER PUBLICATIONS

European Search Report issued in related International Application No. EP 18 21 0534; dated May 29, 2019 (2 pgs.).‡
Office Action issued by the Intellectual Property Office (IPO) in related (ROC) Taiwanese Patent Application No. 108144213, dated Aug. 17, 2020, 9 pages.
International Search Report issued by the International Searching Authority in related PCT Application No. PCT/EP2019/081710, dated Mar. 5, 2020, 5 pages.
European Search Report issued in related International Application No. EP 18 21 0534, dated May 29, 2019, 2 pages.
Notice of Reasons for Rejection issued by the Japan Patent Office in related Japanese Patent Application No. 2021-526357; dated May 27, 2022 (13 pgs.).
High voltage vacuum feed through design and construction, "https://www.coultersmithing.com/AuxCP/FT.html" Web Archive dated Dec. 23, 2011, Wayback Machine.

* cited by examiner
‡ imported from a related application

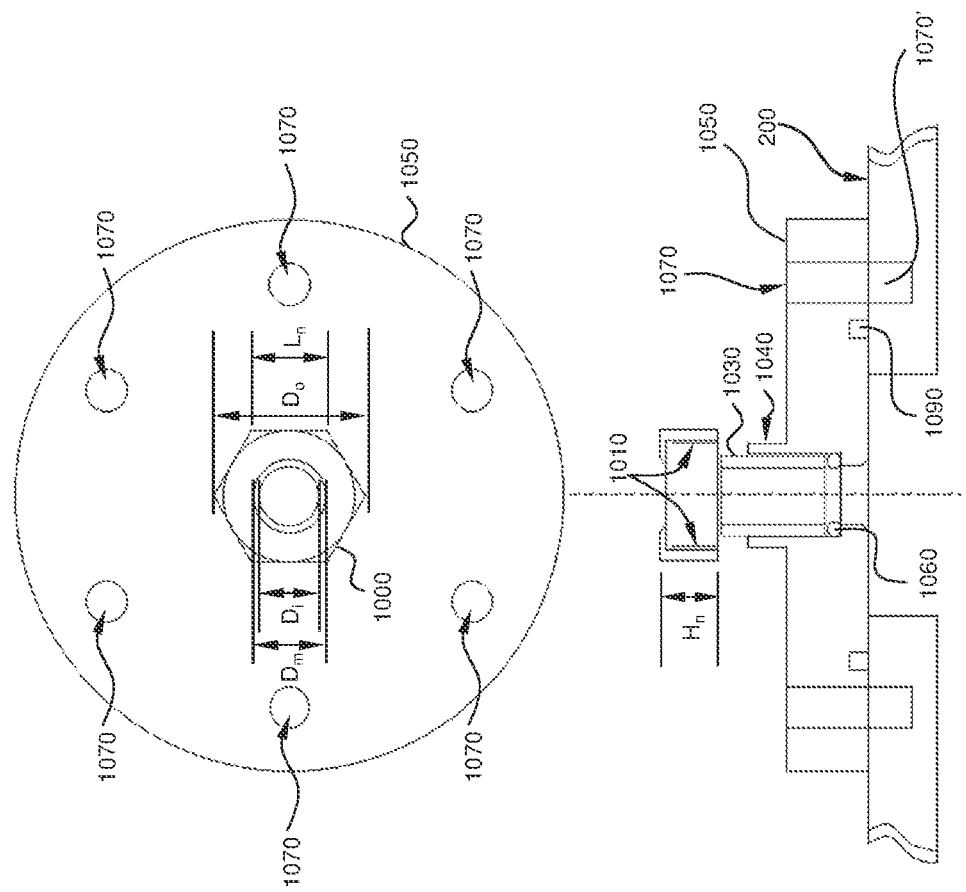

HIGH VOLTAGE VACUUM FEEDTHROUGH

CROSS-REFERENCE TO RELATED APPLICATIONS

This application is a continuation of U.S. application Ser. No. 16/703,729 filed Dec. 4, 2019, which claims priority of EP application 18210534.6 which was filed on Dec. 5, 2018, both of which are incorporated herein by reference in their entireties.

FIELD

Apparatuses and methods consistent with the present disclosure relate generally to electrical connections, and more particularly, to a feedthrough that is used in high voltage and high vacuum conditions.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. The SEM is placed in a vacuum chamber and a feedthrough may be implemented in a chamber wall to electrically connect the SEM and a component outside the chamber. However, a dielectric breakdown of an insulating layer of the feedthrough may cause a short circuit, resulting in a failure of the electrical connection between inside and outside the chamber or even a failure of the operation of the SEM. Further improvements in the art are desired.

SUMMARY

According to some embodiments of the present disclosure, there is provided a feedthrough for providing an electrical connection. The feedthrough may comprise: a conductor; and a quartz tube configured to surround at least a portion of the conductor and provide isolation to the conductor. The conductor may be a metal, such as aluminum, copper, silver, cobalt, nickel, gold, tungsten, magnesium, platinum or stainless steel, among others. The conductor may have a cylindrical shape. The conductor and the quartz tube may be coaxially arranged. The conductor may comprise a plurality of conductors that arranged in a common plane. The conductor may comprise a rigid or flexible printed circuit board. In the feedthrough, at least one end of the quartz tube may have a recess. In the feedthrough, the quartz tube may be a bent tube. In the feedthrough, a thickness of a first part of the quartz tube may be greater than a thickness of a second part of the quartz tube.

The feedthrough may further comprise an adhesion layer that is disposed between the conductor and the quartz tube and attaches the conductor to the quartz tube in an airtight manner. The adhesion layer may be a capillary adhesive or a vacuum degassed adhesive. The conductor and the quartz tube may be detachably mounted.

The feedthrough may further comprise a first connector that is disposed at a first end of the conductor and connects the conductor to a power supply; and a second connector that is disposed at a second end of the conductor and connects the conductor to an electrical component. The feedthrough may further comprise a plurality of holders that hold a plurality of quartz tubes and a flange that holds the plurality of holders. The feedthrough may further comprise a sealer that seals the feedthrough with a housing in an airtight manner. The sealer may be an O-ring or any sealant suitable for securing a vacuum in a vacuum system.

According to some embodiments of the present disclosure, there is provided a feedthrough for providing an electrical connection. The feedthrough may comprise: a conductor; and a glass tube configured to surround at least a portion of the conductor and provide isolation to the conductor. The glass tube may be made of an alkali-free glass. A thermal expansion coefficient of the glass tube may be close to a thermal expansion coefficient of the conductor. The feedthrough may be implemented in a chamber enclosing scanning electron microscope (SEM) such that the feedthrough may provide electrical connections between the SEM and components outside the chamber. A voltage ranged between 10 kV and 100 kV may be passed to the SEM through the feedthrough.

According to some embodiments of the present disclosure, there is provided a vacuum system. The vacuum system may comprise: a vacuum chamber for containing a sample; and a feedthrough for providing an electrical connection between an inside and an outside the chamber, the feedthrough may comprise: a conductor; and a quartz tube surrounding at least a portion of the conductor. The vacuum chamber may comprise an aperture into which the feedthrough is inserted. The vacuum system may further comprise an adhesion layer that is disposed between the conductor and the quartz tube and attaches the conductor to the quartz tube in an airtight manner. In the vacuum system, a first end of the electrical conductor may be disposed in a vacuum and a second end of the electrical conductor is disposed at atmosphere. In the vacuum system, a thickness of a first part of the quartz tube disposed in the vacuum chamber may be greater than a thickness of a second part of the quartz tube disposed in the air. In the vacuum system, the quartz tube may be a bent tube. In the vacuum system, the feedthrough may interest a wall of the vacuum chamber all the way along a circumference of the vacuum chamber. In the vacuum system, the feedthrough may be used at a voltage ranged between 10 kV and 100 kV. In the vacuum system, a pressure of the vacuum chamber may be ranged between $10^{-4}$ and $10^{-8}$ mbar.

According to some embodiments of the present disclosure, there is provided a vacuum system. The vacuum system may comprise: a vacuum chamber for containing a sample; and a feedthrough for providing an electrical connection between an inside and an outside the chamber, the feedthrough comprising: a conductor; and a glass tube surrounding at least a portion of the conductor.

According to some embodiments of the present disclosure, there is provided a method of forming an electrical feedthrough. The method may comprise: applying an adhesion layer on an outer surface of a conductor; and inserting the conductor into a quartz tube such that the inner surface of the quartz tube attaches to the outer surface of the conductor in an airtight manner.

According to some embodiments of the present disclosure, there is provided a method of forming an electrical feedthrough. The method may comprise: bending a quartz tube; inserting a flexible conductor into the quartz tube by pressing the flexible conductor into the quartz tube; and applying capillary adhesive into a gap between the quartz tube and the flexible conductor.

The subject matter below is taught by way of various specific exemplary embodiments explained in detail, and illustrated in the enclosed drawing figures.

BRIEF DESCRIPTION OF FIGURES

FIG. 10 is a top plan view showing a schematic diagram illustrating an exemplary flange for holding a feedthrough, consistent with some embodiments of the present disclosure.

FIG. 11 is a cross-sectional view showing a schematic diagram illustrating an exemplary installation the flange of FIG. 10 in a vacuo chamber, consistent with some embodiments of the present disclosure.

DETAILED DESCRIPTION

Figure 1:
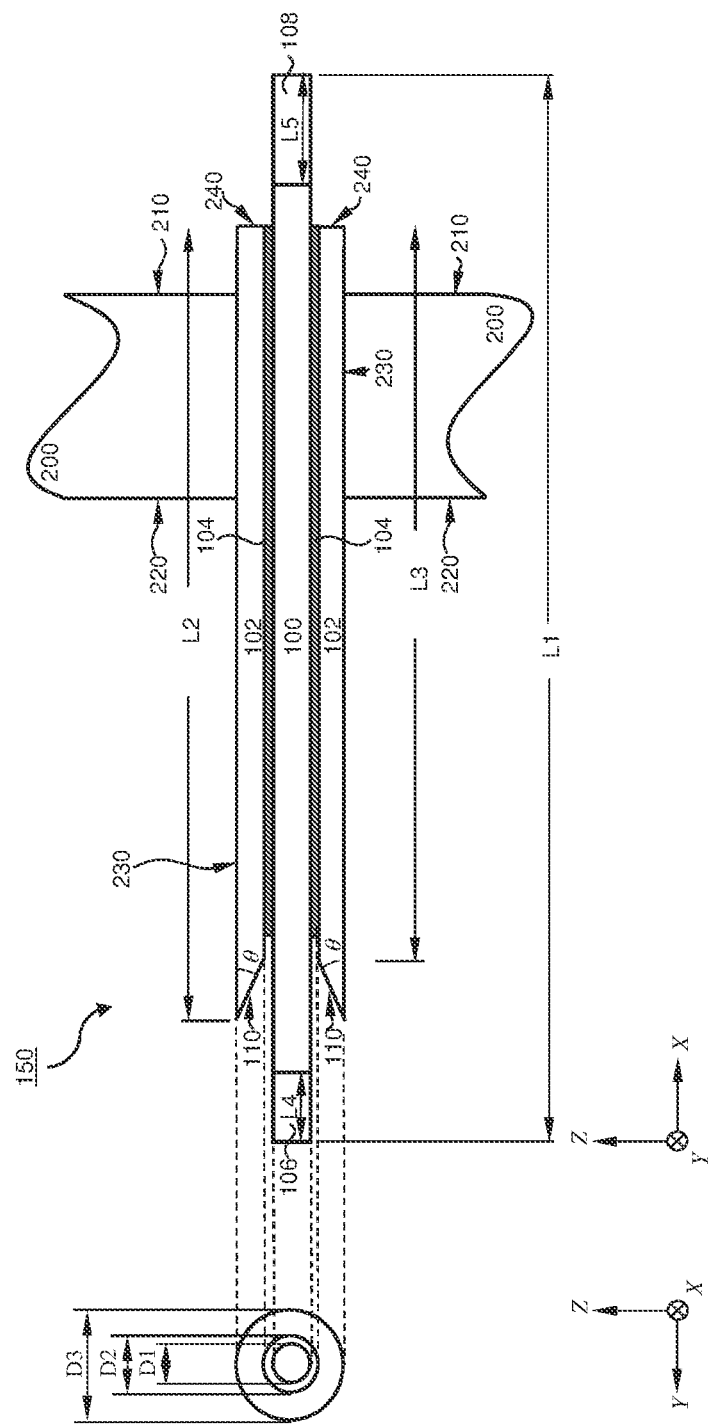
FIG. 1 is a schematic diagram illustrating cross-sectional view of an exemplary feedthrough, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing scanning electron microscope (SEM) for generation of a wafer image and defect detection, the disclosure is not so limited. Other types of vacuum systems such as transmission electron microscope (TEM) and scanning tunneling microscope (STM) be similarly applied. Some embodiments of the present disclosure can be used in any vacuum system such as in physical/chemical vapor deposition chambers, reactive ion etching chambers, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $\frac{1}{1000}^{th}$ of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

In various steps of the semiconductor manufacturing process, pattern defects can appear on at least one of a wafer, a chip, or a mask, which can cause a manufactured semiconductor device to fail, thereby reducing the yield to a great degree. As semiconductor device sizes continually become smaller and smaller (along with any defects), identifying defects becomes more challenging and costly. Currently, engineers in semiconductor manufacturing lines usually spend usually hours (and even sometimes days) to identify locations of small detects to minimize their impact on the final product.

Conventional optical inspection techniques are ineffective in inspecting small defects (e.g., nanometer scale defects). Advanced electron-beam inspection (EBI) tools, such as a scanning electron microscope (SEM) with high resolution and large depth-of-focus, have been developed to meet the need in the semiconductor industry. In a SEM, electrons of a single primary electron beam, or electrons of a plurality of primary electron beams, can be focused at one or more scan locations of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and/or external structures of the wafer.

At atmospheric pressure, the electrons (or other charged particles) suffer frequent collisions with gas molecules in the air and are deflected from their path. The mean free path of the electrons at atmospheric pressure is too small for practical inspection applications. Thus, a vacuum chamber, from which air and other gases are removed by a vacuum pump, is used for a chamber housing the SEM, and a vacuum feedthrough is used for an electrical connection between a power source (e.g., high voltage source) outside the vacuum chamber and an electric equipment inside the vacuum chamber.

Generally, a vacuum feedthrough comprises an electrical conductor (e.g., round metal bar) and an insulator (e.g., ceramics) enclosing and shielding the electrical conductor. While ceramics have advantages, such as high stability during thermal treatment and a low outgassing rate, they have limits in dielectric strength at high vacuum or high voltage, especially at the place where an insulator, a metal, and vacuum are in close proximity (i.e., triple point). Another inherent challenge in using ceramics is that the conductor material and the ceramic material are in bonded contact, and replacement of a damaged ceramic material would require replacement of an entire feedthrough. Moreover, in the manufacturing process, ceramics are sintered (i.e., caused to become a coherent mass by heating without melting) at high temperature to make them vacuum-tight. To make a feedthrough, a metal may need to be brazed into a sintered ceramic at high temperatures (>100° C.), requiring good matching of thermal expansion coefficients of the metal and the ceramic to prevent mechanical stress and crack-formation during cooling, further limiting the choice of ceramic materials as well as metal conductors.

The disclosed embodiments provide a vacuum feedthrough having dielectric strength that can withstand high vacuum and high voltage, without increasing a size (or a thickness) of the dielectric isolation layer of the feedthrough. Accordingly, the feedthrough can be used in a high vacuum chamber of the inspection system under high voltage conditions without risk of dielectric breakdown, thereby preventing failure of the inspection system and leading to higher throughput.

The disclosed embodiments provide not only small sized high voltage vacuum feedthrough, but also a cheap, easy repairable, and universal feedthrough that is compatible with many electrical components having various sizes. Moreover, the disclosed embodiments provide an adaptable feedthrough that may be adjusted according to space limitations.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

References are now made to FIG. 1, a schematic diagram illustrating a cross-sectional view of an exemplary feedthrough, consistent with some embodiments of the present disclosure. As shown in FIG. 1, a feedthrough 150 includes a conductor 100, an adhesive layer 104, and a quartz tube 102. In some embodiments, feedthrough 150 is implemented through an aperture of a vacuum chamber (e.g., a SEM chamber) having a chamber wall 200. Chamber wall 200 has an inner surface 220 facing a vacuum created inside the vacuum chamber, and an outer surface 210 facing an ambient atmosphere. A pressure of the vacuum chamber may be ranged between 10-4 and 10-10 mbar. At a pressure higher than 10-4 mbar, for example, at a pressure ranged from 1000 mbar to 10-4 mbar, high voltage is limited by other physics, including Paschen discharge in the gas. On the other hand, a pressure lower than 10-10 mbar cannot be easily achieved in a SEM vacuum system. In some embodiments, feedthrough 150 is inserted into an aperture of chamber wall 200 of the vacuum chamber, and a sealer (not shown) such as an O-ring seals feedthrough 150 in an airtight manner or any sealant suitable for securing a vacuum in a vacuum system. In some embodiments, feedthrough 150 is inserted into chamber wall 200 of the vacuum chamber across the chamber all the way to the opposite side of the vacuum chamber wall.

In some embodiments, conductor 100 is formed of a metal (or a metal alloy) such as aluminum, copper, silver, cobalt, nickel, gold, tungsten, magnesium, platinum, or stainless steel, among others. While a metal may be a pure metal and not a metal alloy, for purposes of simplicity, the use of the term metal hereinafter includes pure metal as well as metal alloys. In some embodiments, the metal is a metal having low thermal expansion coefficient or a metal having thermal expansion coefficient close to a thermal expansion coefficient of a quartz material or a glass material. For example, a thermal expansion coefficient mismatch between the metal and the quartz/glass may be less than 15%. If the thermal expansion coefficient mismatch is greater than 15%, the feedthrough may not be suitable for processing or application in an increased temperature, for example, curing the glue or some minor heating for faster outgassing and pumping because the thermal mismatch can result in breaking the glass or glue. In some embodiments, conductor 100 comprises a plurality of conductors that are electrically isolated from each other and arranged on a common plane, such as conductors on a printed circuit board. A maximum voltage difference between the plurality of conductors may be ranged between 10-100 V. In some embodiments, conductor 100 comprises a rigid or a flexible printed circuit board(s). In some embodiments, conductor 100 is a rod with a cross-sectional shape of a circle, ellipse, square, rectangle, triangle, oval, or hexagon, among others. In some embodiments, conductor 100 has a uniform diameter along the lengthwise direction of the conductor. In some embodiments, conductor 100 has a non-uniform diameter along the lengthwise direction of the conductor, for example, a portion of the conductor at the vacuum side may have diameter smaller than that of the other part of the conductor, and thereby may prevent an electrical breakdown. In some embodiments, a full length L1 of conductor 100 is greater than a thickness of chamber wall 200, i.e., a distance between inner surface 220 and outer surface 210 of chamber wall 200. In some embodiments, conductor 100 is used at a high voltage, for example, a voltage ranged between 10 kV and 100 kV, which is a sufficient voltage range for equipment in vacuum systems, including a SEM.

In FIG. 1, conductor 100 has a connector 106 positioned inside the chamber having chamber wall 200. Connector 106 may be threaded (e.g., M3 threaded) or may not be threaded. A length L4 of connector 106 can vary, for example, being a length of 2 cm in some applications, being a length of 1 cm in other applications. In FIG. 1, conductor 100 includes another connector 108 positioned outside the chamber having chamber wall 200. A length L5 of connector 108 can vary, for example, being a length of 5 cm in some applications, being a length of 4 cm in other applications. Connector 108 may be threaded or may be not threaded. For example, connector 108 may be M3 threaded with a 0.5 mm separation between two of the adjacent threads. Length L5 may be greater than length L4, or may be shorter than length L4; that is, connector 108 may be longer than connector 106, or may be shorter than connector 106. Connector 106 may be electrically connected to a component, such as the scanning electron microscope of FIG. 9, placed inside the vacuum chamber having chamber wall 200, and connector 108 may be connected to a component outside of the vacuum chamber, such as a power supply (not shown), thereby ensuring an electrical connection between the inside and the outside the chamber. In some embodiments, connectors 106 and 108 may be portions of conductor 100. In other embodiments, connectors 106 and 108 are additional pieces of materials that are different from conductor 100 and attached to conductor 100.

In FIG. 1, quartz tube 102 surrounds at least a portion of conductor 100 and provides isolation to conductor 100. In some embodiments, quartz tube 102 may be a hollow rod that has an internal or external cross-sectional shape of any of a circle, ellipse, square, rectangle, triangle, or hexagon. In some embodiments, quartz tube 102 may be a hollow rod that is shaped as any of a circular cylindrical, an elliptical cylindrical, a cuboid with a square cross-section, a cuboid with a rectangle cross-section, a triangular prism, or a hexagonal prism shape, among others. Conductor 100 and quartz tube 102 may be coaxially arranged. Quartz tube 102 may have a thickness of a few millimeters to a few centimeters, depending on conditions (e.g., a vacuum level or a voltage level, among others) under which feedthrough 150 operates. In some embodiments, a breakdown voltage of quartz tube 102 is about 100 kV/mm, and a thickness of quartz tube 102 may be about 1 mm such that quartz tube 102 may withstand a voltage as high as 100 kV. Quartz tube 102 has a recess 110 at the end positioned in the vacuum side. Recess 110 makes it easier to fill the gap between conductor 100 and quartz tube 102 with an adhesive (such as a glue) and also avoids a high electric field at the point where conductor 100, quartz tube 102 (an insulator) and the vacuum meet (a triple point), thereby preventing electric breakdown at the triple point. At the triple point, electrons field-emitted at the metal can easily traverse the vacuum to a region adjacent to a surface of the insulator, thereby inducing surface charges on the surface of the insulator. Due to the surface charges, dielectric breakdown can easily occur to the ceramics used at high vacuum or high voltage, causing a short circuit or even failure of the vacuum system. Recess 110 may be a sloped shape with an angle θ ranged between 35 degrees to 65 degrees. If the angle is too large, such as larger than 65 degrees, the prevention of a high electric field at the triple point may not be effective. On the other hand, if the angle is too small, such as less than 35 degrees, it may create sharp corner at the end of the quartz tube and thereby reduce mechanical strength. In some embodiments, quartz tube 102 has an inner surface length L3 greater than a thickness of chamber wall 200 of the vacuum chamber such that only a portion of quartz tube 102 is surrounded by chamber wall 200. In some embodiments, rear surface 240 of quartz tube 102 is positioned at outer surface 210 of chamber wall 200. In some embodiments, quartz tube 102 extends beyond components to which connector 106 may discharge, such as chamber wall 200. Quartz tube 102 may be configured to extend a distance beyond a component, wherein the distance is determined to prevent connector 106 from discharging across a vacuum to any nearby components, such as inner surface 220 of chamber wall 200. For example, quartz tube 102 may extend 1 or 2 cm beyond inner surface 220.

In some embodiments, instead of using quartz, tube 102 is made of glass materials. The glass may be a glass having low ion content such as an alkali-free glass, or a glass having high thermal expansion coefficient such as calcium zinc borosilicate glass, alkali aluminophosphate glass, aluminosilicate glass, boroaluminasilicate glass, and tellurium-containing glass, among others. In some embodiments, a thermal expansion coefficient of a glass substantially matches with a thermal expansion coefficient of a conductor of a feedthrough. In some embodiments, "substantially matches" means that a mismatch of the thermal expansion coefficients is less than 15%. For simplicity, quartz tubes and glass tubes are collectively called "quartz tubes" hereinafter.

In FIG. 1, the inner surface of quartz tube 102 is attached to conductor 100 through adhesive layer 104 in an airtight manner. In some embodiments, adhesive layer 104 covers the entire inner surface length L3 of quartz tube 102. In other embodiments, adhesive layer 104 covers a portion of the inner surface length L3 of quartz tube 102. For example, in some embodiments a portion of quartz tube 210 in the vacuum side is not filled with the adhesive. This may further avoid high electric field at the triple point where the conductor, the insulator and the vacuum meet, thereby preventing electric breakdown at the triple point. In some embodiments, a portion of quartz tube 210 in the ambient atmosphere side is not filled with the adhesive. Adhesive layer 104 may be a capillary adhesive or a vacuum degassed adhesive, among others. In some embodiments, quartz tube 102 is detachably mounted to conductor 100. Adhesive layer 104 may provide mechanical strength to quartz tube 102 thereby improving mechanical strength of the feedthrough so that the feedthrough can withstand external pressure, especially at the portion of the feedthrough where a sealant (e.g., O-ring) compresses the quartz tube.

The left portion of FIG. 1 is a front view of feedthrough 150. In the front view, conductor 100 has a diameter of D1, adhesive layer 104 surrounding conductor 100 has an outer diameter D2, and quartz tube 102 has an outer diameter D3. The value of D1, D2, and D3 can be determined based on a desired voltage to be applied to feedthrough 150 and a desired vacuum level at which the SEM (or other vacuum equipment) operates. In some embodiments, D1, D2, and D3 may be 2 cm, 2.5 cm, and 5 cm, respectively.

Quartz tube 102 used in feedthrough 150 provides high dielectric strength to the feedthrough 150 so that feedthrough 150 can withstand a high vacuum or a high voltage without having dielectric breakdown. Such a high dielectric strength can be provided without increasing a size (or a thickness) of the quartz isolation layer (e.g., quartz tube 102), rendering small sized vacuum feedthrough 150. Also, by using inexpensive and easy-replaceable quartz tube 102, the cost of manufacturing feedthrough 150 is reduced. The easy availability of quartz tubes having different dimensions (length and thickness) also renders flexibility in application of the feedthrough for various equipment.

Figures 2A, 2B:
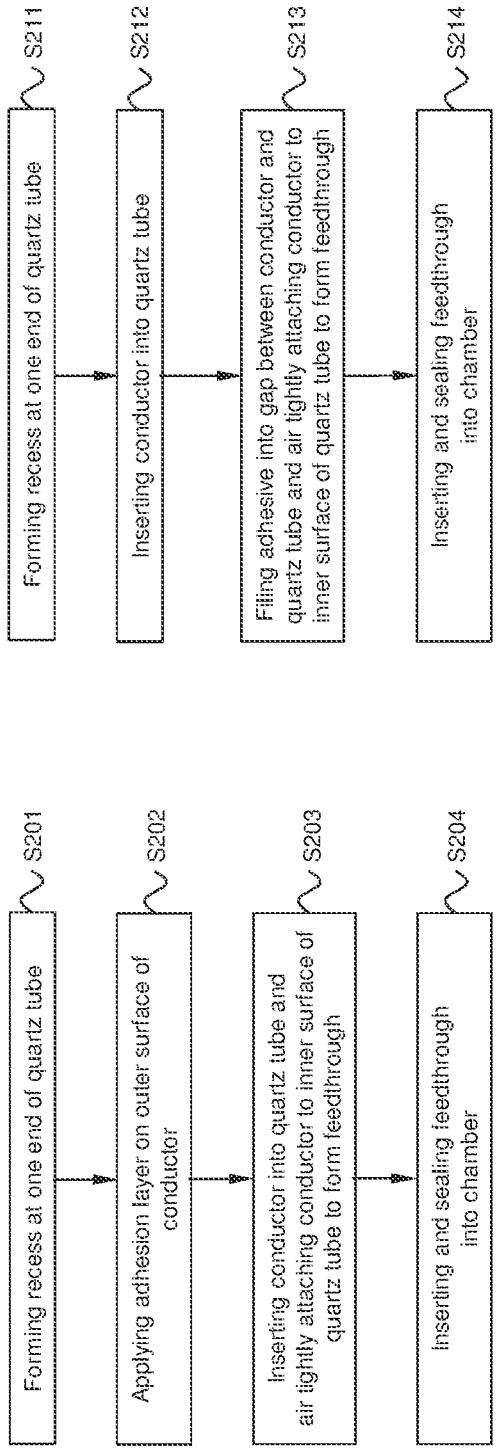
FIG. 2A is a flow chart illustrating an exemplary method of forming and installing the feedthrough of FIG. 1.
FIG. 2B is a flow chart illustrating another exemplary method of forming and installing the feedthrough of FIG. 1, consistent with some embodiments of the present disclosure.

FIG. 2A is a flow chart illustrating an exemplary method of forming and installing the feedthrough of FIG. 1, and FIG. 2B is a flow chart illustrating another exemplary method of forming and installing the feedthrough of FIG. 1, consistent with some embodiments of the present disclosure. As shown in FIG. 2A, in step S2010, a recess is formed at one end of a quartz tube, such as quartz tube 102 in FIG. 1. The recess may be recess 110 of FIG. 1 having a recess angle ranged between 35-65 degrees. The end of the quartz tube having the recess is placed in the vacuum side of a vacuum chamber. By forming the recess at the point where the insulator (the quartz tube), the conductor (described in S202) and the vacuum meet (a triple point), a dielectric breakdown at the triple point may be prevented.

In step S202, an adhesion layer, such as adhesive layer 104 of FIG. 1, is applied on an outer surface of a conductor, such as conductor 100 of FIG. 1. In some embodiments, an adhesive layer is applied on the entire outer surface of the conductor. In some embodiments, an adhesive layer is applied on a portion of the outer surface of the conductor so that a portion of the conductor to be placed at the vacuum side is not covered with the adhesive. By partially applying an adhesive layer, a high electric field at the triple point may be avoided, thereby preventing a dielectric breakdown at the triple point.

In step S203, the conductor is inserted into the quartz tube, and the conductor is attached air tight to the inner surface of the quartz tube to form a feedthrough. By applying an adhesive layer between the conductor and the quartz tube, the mechanical strength of the quartz tube is improved enabling the feedthrough to withstand higher pressure, especially at the portion of the feedthrough where a sealant (e.g., O-ring) compresses the quartz tube.

In step S204, the feedthrough is inserted into a vacuum chamber through a chamber wall and sealed with a sealant. To one of ordinary skill in the art, additional steps can be added to the flow chart in FIG. 2A and the steps can be subtracted and re-arranged.

As shown in FIG. 2B, in step S211, a recess is formed at one end of a quartz tube, such as quartz tube 102 in FIG. 1. The recess may be recess 110 of FIG. 1 having a recess angle ranged between 35-65 degrees.

In step S212, a conductor, such as conductor 100 of FIG. 1, is inserted into the quartz tube. In step S213, an adhesive is filled into the gap between the quartz tube and the conductor, for example, using capillary filling. The recess formed in step S211 may make it easier to fill the adhesive into the gap between the quartz tube and the conductor. In some embodiments, the adhesive fills the entire gap between the quartz tube and the conductor. In some embodiments, the adhesive partially fills the gap between the quartz tube and the conductor such that a portion of the conductor (e.g., the portion to be placed in the vacuum is not covered with the adhesive. By partially applying an adhesive layer, a high electric field at the triple point may be avoided, thereby preventing an electric breakdown at the triple point. The filled portion of the adhesive may make the conductor to be attached air tight to the inner surface of the quartz tube to form a feedthrough.

In step S214, the feedthrough is inserted into a vacuum chamber through a chamber wall and sealed with a sealant. To one of ordinary skill in the art, additional steps can be added to the flow chart in FIG. 2B and the steps can be subtracted and re-arranged.

Figure 3:
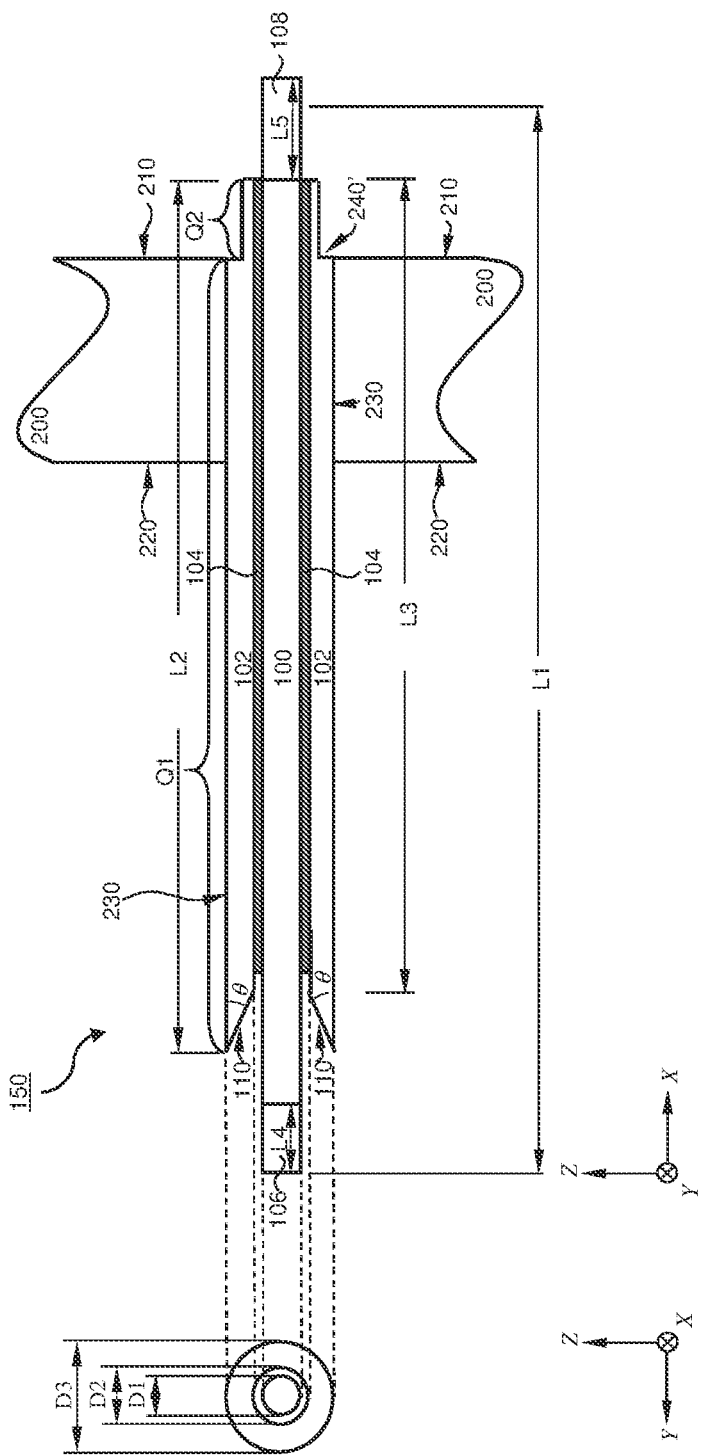
FIG. 3 is a schematic diagram illustrating a cross-sectional view of another exemplary feedthrough, consistent with some embodiments of the present disclosure.

References are now made to FIG. 3, a schematic diagram illustrating a cross-sectional view of another exemplary feedthrough, consistent with some embodiments of the present disclosure. As shown in FIG. 3, a feedthrough 150 includes a conductor 100, an adhesive layer 104, and a quartz tube 102. Comparing to FIG. 1, the quartz tube in FIG. 3 has two portions, a first portion Q1 and a second portion Q2, wherein first portion Q1 has a thickness greater than a thickness of second portion Q2. The thinner second portion is positioned outside a chamber having chamber wall 200 and the thicker first portion is positioned inside the chamber. The portion outside the vacuum chamber is in an ambient environment, and thus, has a smaller risk of dielectric breakdown when compared to the portion inside the vacuum chamber. By thinning the portion less susceptible to dielectric breakdown, the size of the feedthrough is reduced, and the thinner portion of the quartz tube can be conveniently implemented with variously sized components, for example, a flange or a connector, improving compatibility of the feedthrough.

Figure 4:
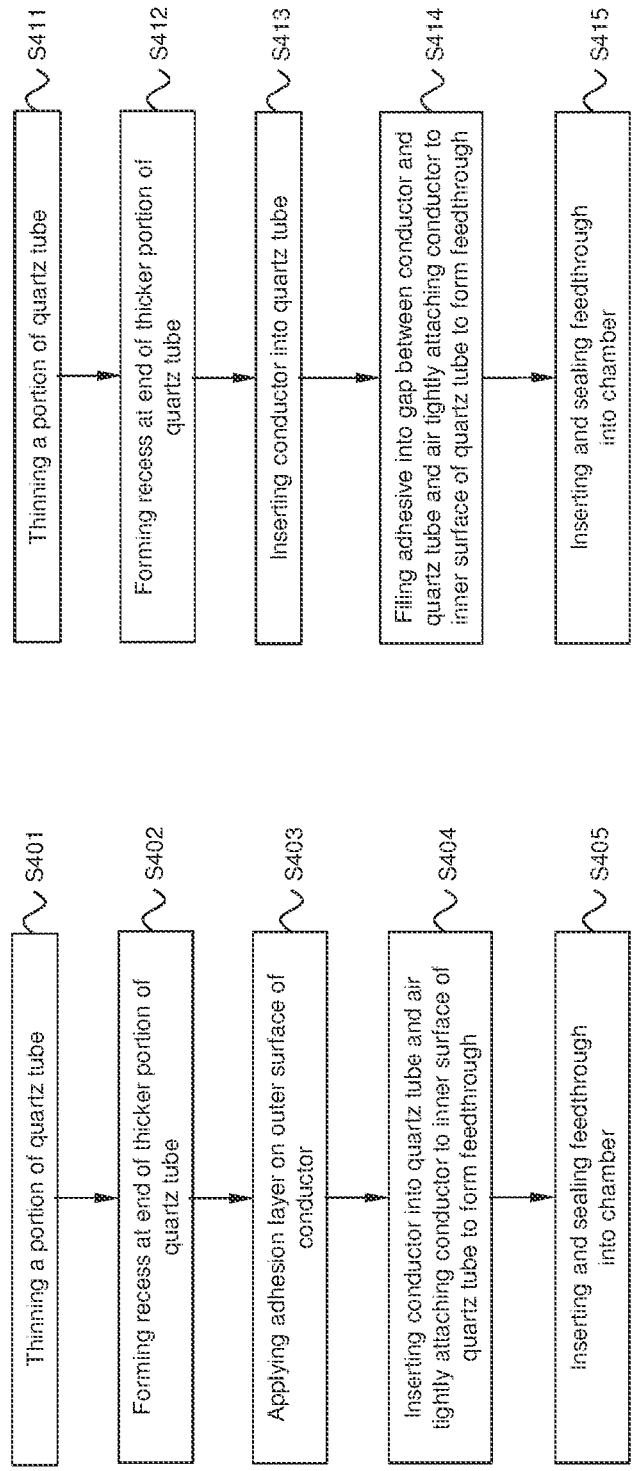
FIG. 4A is a flow chart illustrating an exemplary method of forming and installing the feedthrough of FIG. 3.
FIG. 4B is a flow chart illustrating another exemplary method of forming and installing the feedthrough of FIG. 3, consistent with some embodiments of the present disclosure.

FIG. 4A is a flow chart illustrating an exemplary method of forming and installing the feedthrough of FIG. 3, and FIG. 4B is a flow chart illustrating another exemplary method of forming and installing the feedthrough of FIG. 3, consistent with some embodiments of the present disclosure. As shown in FIG. 4A, in step S401, a portion of a quartz tube, such as quartz tube 102 in FIG. 3, is thinned so that one portion of the quartz has a thickness smaller than that the other portion of the quartz tube.

In step S402, a recess is formed at the end of thicker portion of the quartz tube. The recess may be recess 110 of FIG. 3 having a recess angle ranged between 35-65 degrees. The end of the quartz tube having the recess is placed in the vacuum side of a vacuum chamber. By forming the recess at the point where the insulator (the quartz tube), the conductor and the vacuum meet (a triple point), an electric breakdown at the triple point may be prevented. In step S403, an adhesion layer, such as adhesive layer 104 of FIG. 3, is applied on an outer surface of a conductor, such as conductor 100 of FIG. 3. In some embodiments, an adhesive layer is applied on the entire outer surface of the conductor. In some embodiments, an adhesive layer is applied on a portion of the outer surface of the conductor such that a portion of the conductor to be placed at the vacuum side is not covered with the adhesive. By partially applying an adhesive layer, a high electric field at the triple point may be avoided, thereby preventing an electric breakdown at the triple point. In step S404, the conductor is inserted into the quartz tube, attached air tight to the inner surface of the quartz tube to form a feedthrough. By applying an adhesive layer between the conductor and the quartz tube, the mechanical strength of the quartz tube is improved, enabling the feedthrough to be able to withstand higher pressure, especially at the portion of the feedthrough where a sealant (e.g., O-ring) compresses the quartz tube. In step S405, the feedthrough is inserted into a vacuum chamber through a chamber wall and sealed with a sealant. In some embodiments, instead of thinning the quartz tube, two quartz tubes having different thickness are attached to a conductor to form a feedthrough. The two quartz tubes may have the same inner diameter but different outer diameters. Detailed descriptions of the processing are omitted here. To one of ordinary skill in the art, additional steps can be added to the flow chart in FIG. 4A and the steps can be subtracted and re-arranged.

In FIG. 4B, in step S411, a portion of a quartz tube, such as quartz tube 102 in FIG. 3, is thinned so that one portion of the quartz has a thickness greater than that the other portion of the quartz tube. In step S412, a recess is formed at the end of thicker portion of the quartz tube. The recess may be recess 110 of FIG. 1 having a recess angle ranged between 35-65 degrees. In step S413, a conductor, such as conductor 100 of FIG. 3, is inserted into the quartz tube. In step S414, an adhesive is filled into the gap between the quartz tube and the conductor, for example, using capillary filling. The recess formed in step S412 may make it easier to fill the adhesive into the gap between the quartz tube and the conductor. In some embodiments, the adhesive fills the entire gap between the quartz tube and the conductor. In some embodiments, the adhesive partially fills the gap between the quartz tube and the conductor such that a portion of the conductor (e.g., the portion to be placed in the vacuum) is not covered with the adhesive. The filled portion of the adhesive made the conductor attached air tight to the inner surface of the quartz tube to form a feedthrough. In step S415, the feedthrough is inserted into a vacuum chamber through a chamber wall and sealed with a sealant. In some embodiments, instead of thinning the quartz tube, two quartz tubes having different thickness are attached to a conductor, for example, by capillary filling of an adhesive, to form a feedthrough. The two quartz tubes may have the same inner diameter but different outer diameters. Detailed descriptions of the processing are omitted here. To one of ordinary skill in the art, additional steps can be added to the flow chart in FIG. 4B and the steps can be subtracted and re-arranged.

Figure 5:
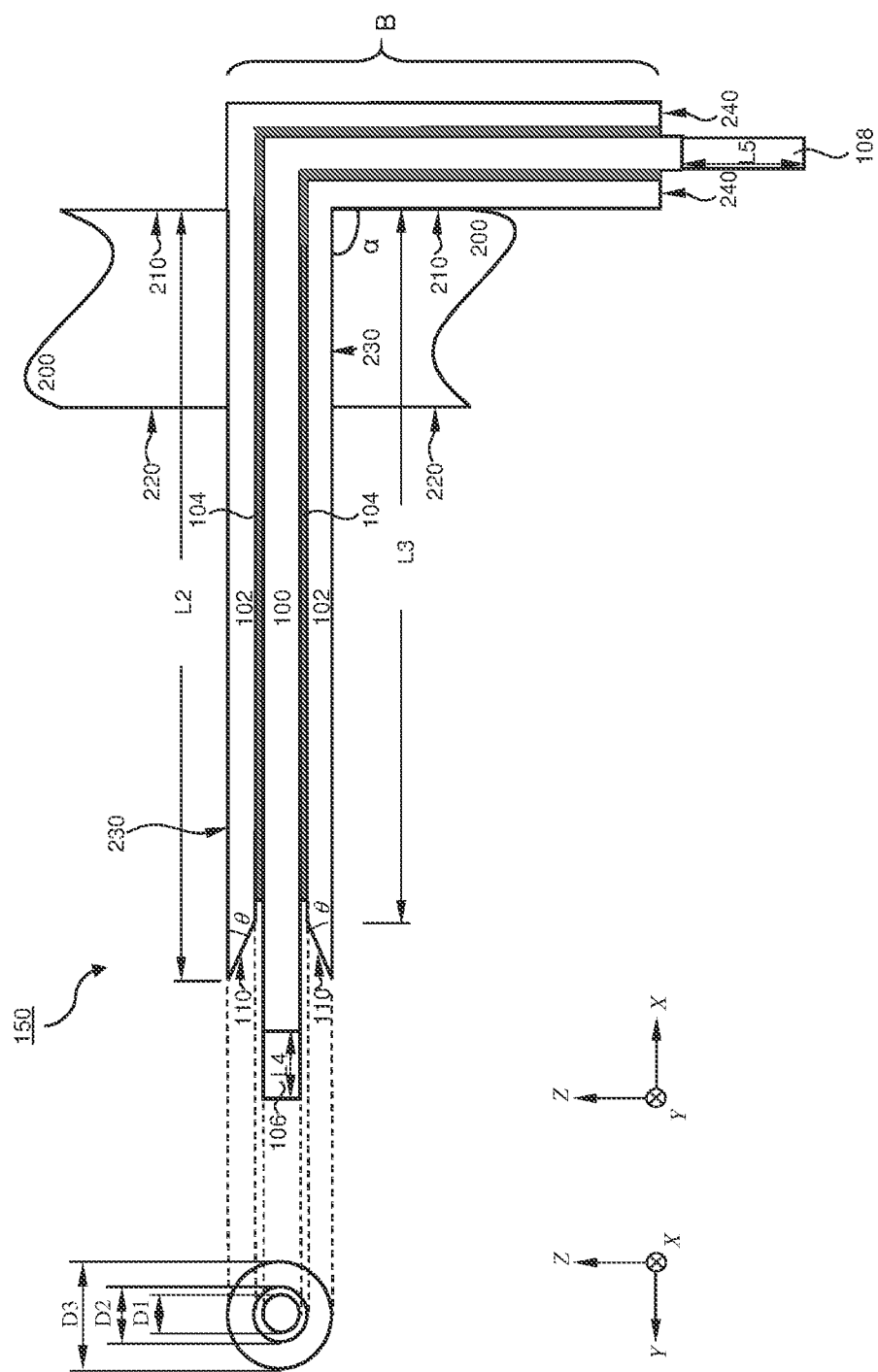
FIG. 5 is a schematic diagram illustrating a cross-sectional view of another exemplary feedthrough, consistent with some embodiments of the present disclosure.

References are now made to FIG. 5, a schematic diagram illustrating a cross-sectional view of another exemplary feedthrough, consistent with some embodiments of the present disclosure. Comparing to FIG. 1, the feedthrough in FIG. 5 has a bent portion B positioned outside the chamber having chamber wall 200. Bent portion B may include bent portion of quartz tube 102, bent portion of adhesion layer 104 and bent portion of conductor 100. A bent angle $\alpha$ may be any angle between 90 degrees and 270 degrees. In some embodiments, the bending of the feedthrough is a curved bending with any desired curvature (not shown). The bent portion of quartz tube 102 may be convenient for space compatibility purposes, such as in situations where there is limited space or other components are positioned near the opening outside the vacuum chamber.

Figure 6:
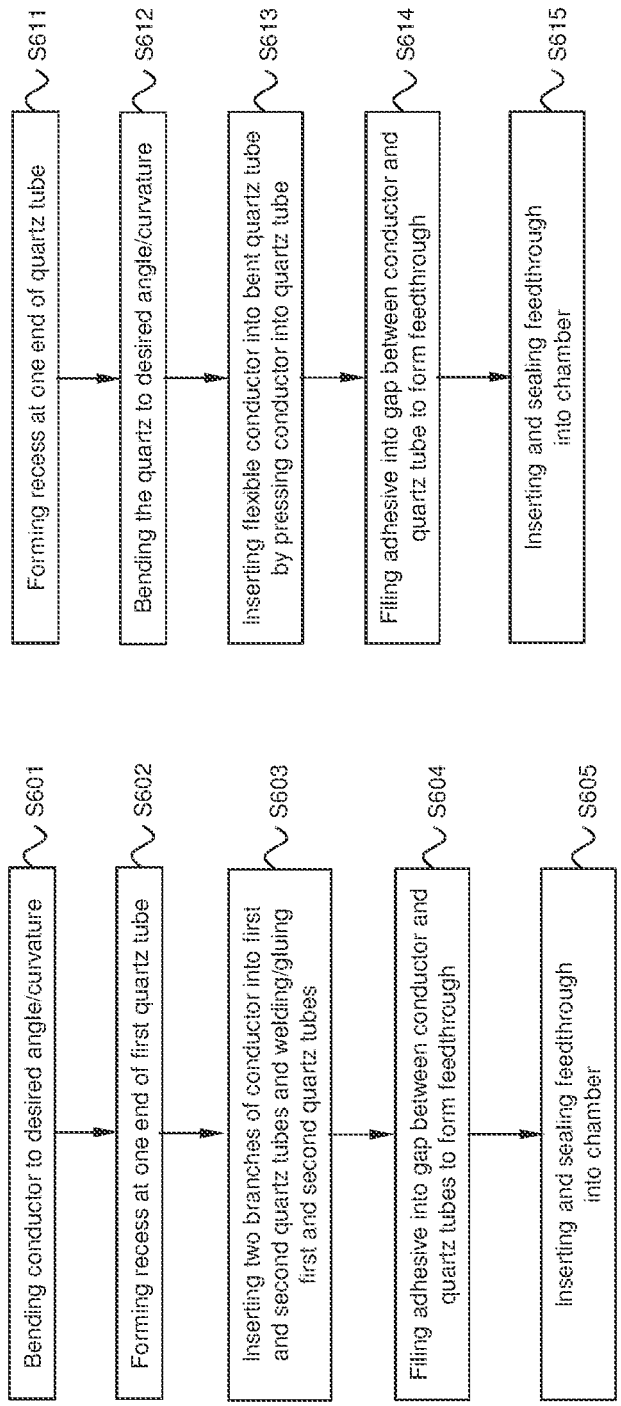
FIG. 6A is a flow chart illustrating an exemplary method of forming and installing the feedthrough of FIG. 5.
FIG. 6B is a flow chart illustrating another exemplary method of forming and installing the feedthrough of FIG. 5, consistent with some embodiments of the present disclosure.

FIG. 6A is a flow chart illustrating an exemplary method of forming and installing the feedthrough of FIG. 5, and FIG. 6B is a flow chart illustrating another exemplary method of forming and installing the feedthrough of FIG. 5, consistent with some embodiments of the present disclosure. As shown in FIG. 6A, in step S601, a conductor, such as conductor 100 of FIG. 1, is bent to a desired angle or curvature (e.g., as shown in FIG. 5).

In step S602, a recess is formed at one end of a first quartz tube. In step S603, a first branch of the bent conductor is inserted into the first quartz tube, and a second branch of the bent conductor into a second quartz tube. The first quartz tube and the second quartz tube are then welded or glued to form a single piece of quartz tube. The two quartz tubes may have the same inner diameter but different outer diameters. In step S604, an adhesive is filled into the gap between the quartz tubes and the conductor, for example, using capillary filling to form a feedthrough. The recess formed in step S602 may make it easier to fill the adhesive into the gap between the quartz tubes and the conductor. In some embodiments, the adhesive fills the entire gap between the quartz tubes and the conductor. In some embodiments, the adhesive partially fills the gap between the quartz tubes and the conductor such that a portion of the conductor (the portion to be placed in the vacuum) is not covered with the adhesive. In step S605, the feedthrough is inserted into a vacuum chamber through a chamber wall and sealed with a sealant. To one of ordinary skill in the art, additional steps can be added to the flow chart in FIG. 6A and the steps can be subtracted and re-arranged.

In FIG. 6B, in step S6111, a recess is formed at one end of a quartz tube, such as quartz tube 102 in FIG. 1. In step S612, the quartz tube is bent to a desired angle or curvature. In step S613, a flexible conductor is inserted into the bent quartz tube by pressing the flexible conductor into the quartz tube. In step S614, an adhesive is filled into a gap between the flexible conductor and the bent quartz tube, and the flexible conductor is attached air tight to the inner surface of the quartz tube to form a feedthrough. In step S615, the feedthrough is inserted into a vacuum chamber through a chamber wall and sealed with a sealant. To one of ordinary skill in the art, additional steps can be added to the flow chart in FIG. 6B and the steps can be subtracted and re-arranged.

Figure 7:
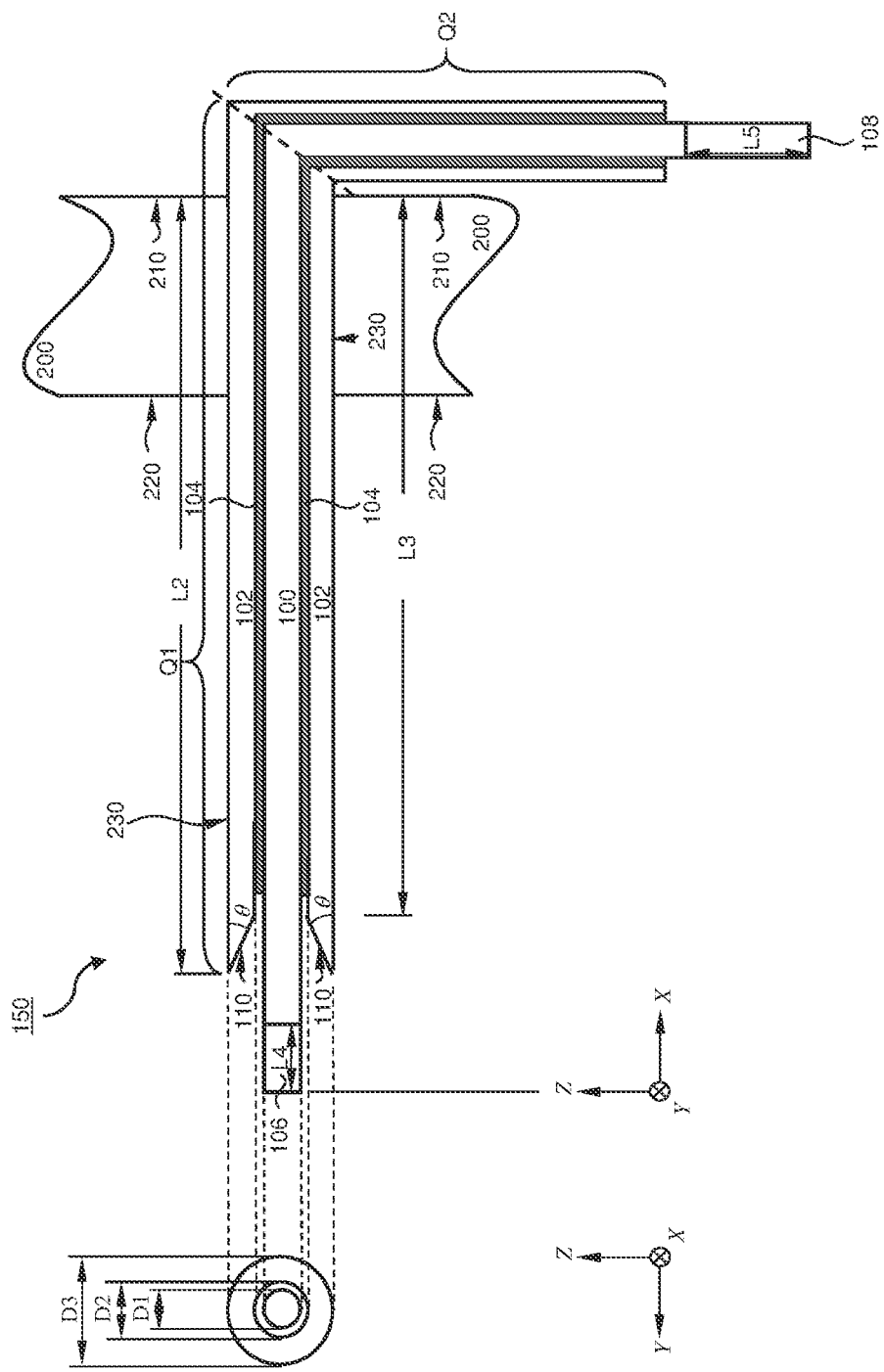
FIG. 7 is a schematic diagram illustrating a cross-sectional view of another exemplary feedthrough, consistent with some embodiments of the present disclosure.

References are now made to FIG. 7, a schematic diagram illustrating a cross-sectional view of other exemplary feedthrough, consistent with some embodiments of the present disclosure. A feedthrough 150 includes a conductor 100, an adhesive layer 104, and a quartz tube 102. Compared to FIG. 5, the feedthrough in FIG. 7 has a bent portion Q2 of quartz tube 102 positioned outside the vacuum chamber. Bent portion Q2 has a thickness smaller than a thickness of portion Q1 of the quartz tube 102. The feedthrough in FIG. 7 can be implemented by the methods shown in FIG. 6 by adding a process of thinning a portion of the quartz tube. The thinner portion is positioned outside the vacuum chamber, which is an ambient environment, and thus, has a smaller risk of dielectric breakdown when compared to the portion of quartz tube 102 that is inside the vacuum chamber. By thinning the portion that is less susceptible to dielectric breakdown, the size of the feedthrough is reduced, and the thinner portion of the quartz tube can be conveniently implemented with variously sized components, for example, a flange or a connector, improving compatibility of the feedthrough. Also, by bending the portion of feedthrough 150 outside the vacuum chamber with any desired angle or curvature, feedthrough 150 can be connected to an element positioned at any place outside of the chamber, thereby improving space compatibility of the feedthrough.

Figure 8:
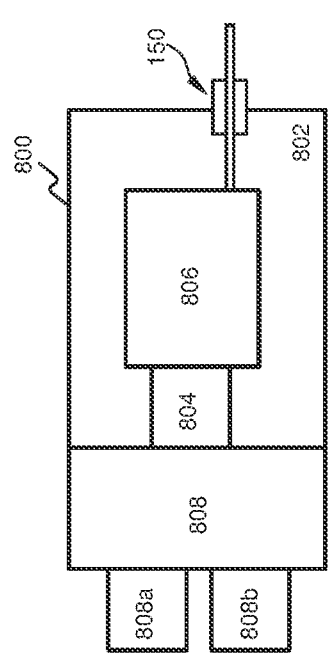
FIG. 8 is a cross-sectional view showing a schematic diagram illustrating an exemplary electron beam inspection (EMI) system having a chamber for the feedthrough of the present disclosure, consistent with some embodiments of the present disclosure.

Reference is now made to FIG. 8, a schematic diagram illustrating an exemplary electron beam inspection system, consistent with some embodiments of the present disclosure. As shown in FIG. 8, electron beam inspection system 800 includes a main chamber 802, a load/lock chamber 804, an electron beam tool 806, and an equipment front end module 808. Electron beam tool 806 is located within main chamber 802. Equipment front end module 808 includes a first loading port 808a and a second loading port 808b. Equipment front end module 808 may include additional loading port(s). First loading port 806a and second loading port 808b receive wafer cassettes that contain wafers (e.g., semiconductor wafers or wafers made of other material(s)) or samples to be inspected (wafers and samples are collectively referred to as "wafers" hereafter). One or more robot arms (not shown) in equipment front end module 808 transport the wafers to load/lock chamber 804. Load/lock chamber 804 is connected to a load/lock vacuum pump system (not shown) which removes gas molecules in load/lock chamber 804 to reach a first pressure below the atmospheric pressure. After reaching the first pressure, one or more robot arms (not shown) transport the wafer from load/lock chamber 804 to main chamber 802. Main chamber 802 is connected to a main chamber vacuum pump system (not shown) which removes gas molecules in main chamber 802 to reach a second pressure below the first pressure. After reaching the second pressure, the wafer is subject to inspection by electron beam tool 806. The chamber wall of the main chamber 802 includes an aperture for a feedthrough 150 of the present disclosure to pass through and be sealed by a sealant such as an O-ring (not shown). While the present disclosure provides examples of main chamber 802 housing an electron beam inspection system, it should be noted that aspects of the disclosure in their broadest sense, are not limited to a chamber housing an electron beam inspection system. Rather, it is appreciated that the forgoing principles may be applied to any other chambers with various vacuum levels as well.

Figure 9:
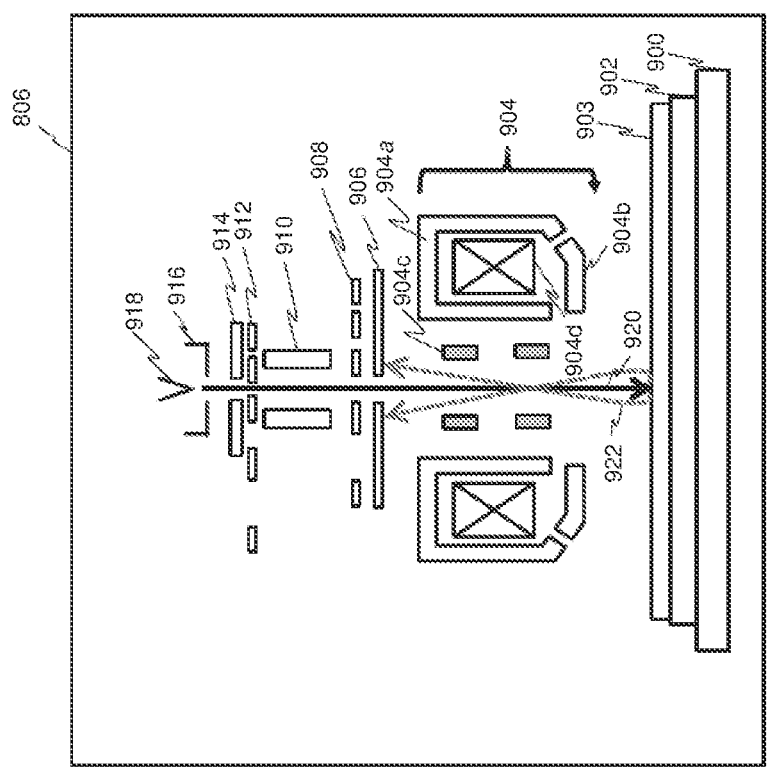
FIG. 9 is a schematic diagram illustrating an exemplary electron beam tool that can be a part of the exemplary electron beam inspection (EBI) system of FIG. 8, consistent with some embodiments of the present disclosure.

References are now made to FIG. 9, a schematic diagram illustrating an exemplary electron beam tool that can be a part of the exemplary electron beam inspection (EBI) system of FIG. 8, consistent with some embodiments of the present disclosure. As shown in FIG. 9, electron beam tool 806 includes a motorized stage 900, and a wafer holder 902 supported by motorized stage 900 to hold a wafer 903 to be inspected. Electron beam tool 806 further includes an objective lens assembly 904, electron detector 906 (which includes electron sensor surfaces), an objective aperture 908, a condenser lens 910, a beam limit aperture 912, a gun aperture 914, an anode 916, and a cathode 918. Objective lens assembly 904, in some embodiments, can include a modified swing objective retarding immersion lens (SORIL), which includes a pole piece 904a, a control electrode 904b, a deflector 904c, and an exciting coil 904d. Electron beam tool 806 may additionally include an energy dispersive X-ray spectrometer (EDS) detector (not shown) to characterize the materials on the wafer.

A primary electron beam 920 is emitted from cathode 918 by applying a voltage between anode 916 and cathode 918. Primary electron beam 920 passes through gun aperture 914 and beam limit aperture 912, both of which can determine the size of electron beam entering condenser lens 910, which resides below beam limit aperture 912. Condenser lens 910 focuses primary electron beam 920 before the beam enters objective aperture 908 to set the size of the electron beam before entering objective lens assembly 904. Deflector 904c deflects primary electron beam 920 to facilitate beam scanning on the wafer. For example, in a scanning process, deflector 904c can be controlled to deflect primary electron beam 920 sequentially onto different locations of top surface of wafer 903 at different time points, to provide data for image reconstruction for different parts of wafer 903. Moreover, deflector 904c can also be controlled to deflect primary electron beam 920 onto different sides of wafer 903 at a particular location, at different time points, to provide data for stereo image reconstruction of the wafer structure at that location. Further, in some embodiments, anode 916 and cathode 918 may be configured to generate multiple primary electron beams 920, and electron beam tool 806 may include a plurality of deflectors 904c to project the multiple primary electron beams 920 to different parts/sides of the wafer at the same time, to provide data for image reconstruction for different parts of wafer 903.

Exciting coil 904d and pole piece 904a generate a magnetic field that begins at one end of pole piece 904a and terminates at the other end of pole piece 904a. A part of wafer 903 being scanned by primary electron beam 920 can be immersed in the magnetic field and can be electrically charged, which, in turn, creates an electric field. The electric field reduces the energy of impinging primary electron beam 920 near the surface of the wafer before it collides with the wafer. Control electrode 904b, being electrically isolated from pole piece 904a, controls an electric field on the wafer to prevent micro-arching of the wafer and to ensure proper beam focus.

A secondary electron beam 922 can be emitted from the part of wafer 903 upon receiving primary electron beam 920. Secondary electron beam 922 can form a beam spot on a surface of a sensor of electron detector 906. Electron detector 906 can generate a signal (e.g., a voltage, a current, etc.) that represents an intensity of the beam spot and provide the signal to a processing system (not shown). The intensity of secondary electron beam 922, and the resultant beam spot, can vary according to the external or internal structure of wafer 903. Moreover, as discussed above, primary electron beam 920 can be projected onto different locations of the top surface of the wafer to generate secondary electron beams 922 (and the resultant beam spot) of different intensities. Therefore, by mapping the intensities of the beam spots with the locations of wafer 903, the processing system can reconstruct an image that reflects the internal or external structures of wafer 903. Once a wafer image is acquired by electron beam tool 806, the wafer image may be transmitted to a computer system (not shown) where the computer system can perform alignment and defect detection.

References are now made to FIG. 10, a top plan view showing a schematic diagram illustrating an exemplary flange for holding a feedthrough, and to FIG. 11, a cross-sectional view showing a schematic diagram illustrating exemplary installation of the flange of FIG. 10 in a vacuum chamber, all of which are consistent with some embodiments of the present disclosure. As shown in the figures, a nut 1000 is configured to be installed with a bush 1030 to a vacuum flange 1050, which in turn is installed to a vacuum chamber wall 200. Nut 1000 may have an aperture of an inner diameter Di slightly greater than the diameter D1 of conductor 100 shown for example in FIG. 1. A tapered edge is connected with the aperture, and the tapered edge has a diameter Dm slightly greater than aperture diameter Di. Nut 1000 may also have an outer circular portion with a diameter of Do and the outer circular portion connects with a hexagonal outer circumference of nut 1000 with a distance Ln between two opposite edges. Also, nut 1000 may have an outer depth Hn and an inner threaded wall 1010. Outer depth Hn of nut 1000 may vary depending on a length of bush 1030. Nut 1000 is configured to push bush 1030 to press an O-ring 1060, and at the same time inner threaded wall 1010 of nut 1000 connects with outer threaded wall 1040 of flange 1050. Through pressing O-ring 1030, the feedthrough, such as feedthrough 150 of FIG. 1, can be stabilized in the vacuum chamber. In some embodiments, the feedthrough is held by one flange 1050.

Flange 1050 has a central hole for the feedthrough to pass through. Also, flange 1050 has screw holes 1070 for screws to pass through flange 1050 and pass into another screw hole 1070' of the chamber wall 200 so as to stabilize flange 1050 with vacuum chamber wall 200. Screw holes 1070 and 1070' may be threaded or unthreaded. Screw holes 1070 align with screw holes 1070' of vacuum chamber wall 200. To secure the vacuum inside vacuum chamber, O-ring slot 1090 is formed on flange 1050. In some embodiments, flange 1050 may have six screw holes 1070, but the number of screw holes is not so limited, and any number of screw holes may be possible as long as flange 1050 is stabilized with vacuum chamber wall 200 with the vacuum inside the chamber secured.

The embodiments may further be described using the following clauses:

1. A feedthrough for providing an electrical connection, comprising:
    a conductor; and
    a quartz structure configured to surround at least a portion of the conductor, configured to provide isolation to the conductor, and configured to extend a distance beyond an internal wall of a vacuum chamber to prevent a discharge between the conductor and a component inside the vacuum chamber.
2. The feedthrough of clause 1, wherein the conductor comprises a metal or metal alloy.
3. The feedthrough of clause 2, wherein the metal or metal alloy comprises at least one of aluminum, copper, silver, cobalt, nickel, gold, tungsten, magnesium, platinum, or stainless steel.
4. The feedthrough of any one of clauses 1 to 3, wherein the conductor is a rod that has an internal or external cross-sectional shape of any of a circle, ellipse, square, rectangle, triangle, oval, or hexagon.
5. The feedthrough of clause 4, wherein the conductor and the quartz structure are coaxially arranged, wherein the component is the vacuum chamber, and wherein the distance is greater than or equal to one centimeter.
6. The feedthrough of at least one of clauses 1 to 5, wherein the conductor comprises a plurality of conductors, and wherein the distance is determined to prevent a discharge between the conductor and the component when the vacuum chamber is holding a vacuum.
7. The feedthrough of clause 6, wherein the plurality of conductors is arranged in a common plane.
8. The feedthrough of clause 7, wherein the plurality of conductors comprises a printed circuit hoard.
9. The feedthrough of clause 1, wherein the conductor comprises a rigid or a flexible printed circuit board.
10. The feedthrough of at least one of clauses 1 to 9, wherein at least one end of the quartz structure has a recess.

11. The feedthrough of clause 10, wherein an angle of the recess is ranged between 35-65°.
12. The feedthrough of at least one of clauses 1 to 11, wherein the quartz structure is a bent cylinder.
13. The feedthrough of at least one of clauses 1 to 12, wherein a thickness of a first part of the quartz structure is greater than a thickness of a second part of the quartz structure.
14. The feedthrough of at least one of clauses 1 to 13, further comprising an adhesion layer that is disposed between the conductor and the quartz structure and attaches the conductor to the quartz structure in an airtight manner.
15. The feedthrough of clause 14, wherein the adhesion layer is a capillary adhesive.
16. The feedthrough of at least one of clauses 14 to 15, wherein the adhesion layer is a vacuum degassed adhesive.
17. The feedthrough of at least one of clauses 1 to 13, wherein the conductor and the quartz structure are detachably mounted.
18. The feedthrough of at least one of clauses 1 to 17, wherein the conductor further comprises:
a first connector that is disposed at a first end of the conductor and connects the conductor to a power supply; and
a second connector that is disposed at a second end of the conductor and connects the conductor to an electrical component, wherein the quartz structure being configured to extend distance beyond the internal wall of the vacuum chamber to prevent the discharge between the conductor and the component includes the quartz structure being configured to extend the distance beyond the internal wall of the vacuum chamber to prevent a discharge between the second connector and the component.
19. The feedthrough of at least one of clauses 1 to 18, further comprising a plurality of holders that hold a plurality of quartz structures.
20. The feedthrough of clause 19, wherein a flange holds the plurality of holders.
21. The feedthrough of at least one of clauses 1 to 20, further comprising a sealer that seals the feedthrough with a housing in an airtight manner.
22. The feedthrough of clause 21, wherein the housing is a vacuum chamber.
23. The feedthrough of at least one of clauses 21 to 22, wherein the sealer comprises a sealant.
24. The feedthrough of at least one of clauses 1 to 23, wherein the quartz structure is a hollow rod that has an internal or external cross-sectional shape of any of a circle, ellipse, square, rectangle, triangle, or hexagon.
25. The feedthrough of at least one of clauses 1 to 23, wherein the quartz structure is a hollow rod that is shaped as any of a circular cylindrical, an elliptical cylindrical, a cuboid with a square cross-section, a cuboid with a rectangle cross-section, a triangular prism, or a hexagonal prism.
26. A feedthrough for providing an electrical connection, comprising:
a conductor; and
a glass structure that surrounds at least a portion of the conductor and provides isolation to the conductor.
27. The feedthrough of at least one of clause 26, wherein the glass structure is made of any one of alkali-free glass, calcium zinc borosilicate glass, alkali aluminophosphate glass, aluminosilicate glass, boroaluminasilicate glass, or tellurium-containing glass.
28. The feedthrough of at least one of clause 26, wherein a mismatch between a thermal expansion coefficient of the glass structure and a thermal expansion coefficient of the conductor is less than 15%.
29. The feedthrough of clauses 1 to 28, wherein the feedthrough is implemented in a chamber of a scanning electron microscope (SEM) such that the feedthrough provides electrical connection between components inside and outside of the chamber.
30. The feedthrough of clause 29, wherein a voltage ranged between 10 kV and 100 kV is passed to the SEM through the feedthrough.
31. A vacuum system comprising:
a vacuum chamber for containing a sample; and
a feedthrough for providing an electrical connection between inside and an outside the chamber, the feedthrough comprising:
a conductor; and
a quartz structure surrounding at least a portion of the conductor.
32. The vacuum system of clause 31, wherein the vacuum chamber comprises an aperture into which the feedthrough is inserted.
33. The vacuum system of clause 31, further comprising an adhesion layer that is disposed between the conductor and the quartz structure and attaches the conductor to the quartz structure in an airtight manner.
34. The vacuum system of at least one of clauses 31 to 33, wherein a first end of the electrical conductor is disposed in a vacuum and a second end of the electrical conductor is disposed at atmosphere.
35. The vacuum system of at least one of clauses 31 to 34, wherein a thickness of a first part of the quartz structure disposed in the vacuum chamber is greater than a thickness of a second part of the quartz structure disposed in the air.
36. The vacuum system of at least one of clauses 31 to 35, wherein the quartz structure is a bent cylinder.
37. The vacuum system of at least one of clauses 31 to 36, wherein the feedthrough interests a wall of the vacuum chamber all the way along a circumference of the vacuum chamber.
38. The vacuum system of at least one of clauses 31 to 37, wherein the feedthrough is used at a voltage ranged between 50 kV and 100 kV.
39. The vacuum system of at least one of clauses 31 to 38, wherein a pressure of vacuum chamber is ranged between $10^{-4}$ and $10^{-10}$ mbar.
40. A vacuum system comprising:
a vacuum chamber for containing a sample; and
a feedthrough for providing an electrical connection between an inside and an outside the chamber, the feedthrough comprising:
a conductor; and
a glass structure surrounding at least a portion of the conductor.
41. The vacuum system of clause 40, wherein the glass structure is made of any one of alkali-free glass, calcium zinc borosilicate glass, alkali aluminophosphate glass, aluminosilicate glass, boroaluminasilicate glass, or tellurium-containing glass.
42. The vacuum system of clause 40, wherein a mismatch between a thermal expansion coefficient of the glass structure and a thermal expansion coefficient of the conductor is less than 15%.
43. A method of forming an electrical feedthrough, the method comprising:

applying an adhesion layer on an outer surface of a conductor; and inserting the conductor into a quartz structure such that the inner surface of the quartz structure attaches to the outer surface of the conductor in an airtight manner.

44. A method of forming an electrical feedthrough, the method comprising:

bending a quartz structure;

inserting a flexible conductor into the quartz structure by pressing the flexible conductor into the quartz tube; and applying capillary adhesive into a gap between the quartz structure and the flexible conductor.

45. The feedthrough of at least one of clauses 21 to 22, wherein the sealer comprises an O-ring.

The flowchart and block diagrams in the Figures illustrate examples of the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "some embodiments" or "some exemplary embodiments" mean that a particular feature, structure, or characteristic described in connection with the embodiment can be included in at least one embodiment. The appearance of the phrases "one embodiment" "some embodiments" or "some exemplary embodiments" in various places in the specification do not all necessarily refer to the same embodiment, nor are separate or alternative embodiments necessarily mutually exclusive of other embodiments.

It should be understood that the steps of the example methods set forth herein are not necessarily required to be performed in the order described, and the order of the steps of such methods should be understood to be merely example. Likewise, additional steps may be included in such methods, and certain steps may be omitted or combined, in methods consistent with various embodiments.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word is intended to present concepts in a concrete fashion.

Additionally, the articles "a" and "an" as used in this application and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

The use of figure numbers or figure reference labels in the claims is intended to identify one or more possible embodiments of the claimed subject matter to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

It will be further understood that various changes in the details, materials, and arrangements of the parts which have, been described and illustrated in order to explain the nature of described embodiments may be made by those skilled in the art without departing from the scope as expressed in the following claims.

What is claimed is:

1. A vacuum system comprising:
   a vacuum chamber; and
   a feedthrough coupled to the vacuum chamber and configured to provide an electrical connection between an inside and an outside of the vacuum chamber, the feedthrough comprising:
      a conductor;
      an insulating structure surrounding at least a portion of the conductor, wherein the insulating structure comprises quartz or glass; and
      an adhesion layer that attaches the conductor to the insulating structure in an airtight manner.

2. The system of claim 1, wherein the adhesion layer covers at least a portion of the insulating structure.

3. The system of claim 1, wherein the adhesion layer comprises a capillary adhesive or a vacuum degassed adhesive.

4. The system of claim 1, wherein a thickness of a first part of the insulating structure is greater than a thickness of a second part of the insulating structure.

5. The system of claim 4, wherein the first part of the insulating structure is positioned on a first side of the vacuum chamber and the second part of the insulating structure is positioned on a second side of the vacuum chamber, where the first side of the vacuum chamber is external to the vacuum chamber and the second side of the vacuum chamber is internal to the vacuum chamber.

6. The system of claim 1, wherein the feedthrough comprises a bent portion.

7. The system of claim 6, wherein the bent portion comprises a bent angle between 90-270°.

8. The system of claim 6, wherein the bent portion comprises the insulating structure, the adhesion layer, and the conductor.

9. The system of claim 8, wherein the insulating structure comprises a first part on a first side of the bent portion and a second part on a second side of the bent portion.

10. The system of claim 9, wherein a thickness of a first part of the insulating structure is greater than a thickness of a second part of the insulating structure.

11. The system of claim 10, wherein the first part of the insulating structure is positioned on a first side of the vacuum chamber and the second part of the insulating structure is positioned on a second side of the vacuum chamber, where the first side of the vacuum chamber is external to the vacuum chamber and the second side of the vacuum chamber is internal to the vacuum chamber.

12. The system of claim 1, wherein the conductor and the insulating structure are coaxially arranged.

13. The system of claim 1, wherein the conductor comprises a plurality of conductors, and the insulating structure is configured to extend a distance beyond an internal wall of the vacuum chamber, wherein the distance is determined to prevent a discharge between the conductor and a component inside the vacuum chamber when the vacuum chamber is holding a vacuum.

14. The system of claim 13, wherein the plurality of conductors are part of a printed circuit board.

15. The system of at least one of claim 1, wherein at least one end of the insulating structure has a recess and an angle of the recess is ranged between 35-65°.

16. The system of claim 1, wherein the conductor further comprises:
 a first connector that is disposed at a first end of the conductor and connects the conductor to a power supply; and
 a second connector that is disposed at a second end of the conductor and connects the conductor to an electrical component, wherein the insulating structure being configured to extend a distance beyond an internal wall of the vacuum chamber to prevent the discharge between the conductor and a component inside the vacuum chamber includes the insulating structure being configured to extend the distance beyond the internal wall of the vacuum chamber to prevent a discharge between the second connector and the component.

17. The system of claim 1, further comprising a sealer that seals the feedthrough with the vacuum chamber in an airtight manner.

18. The system of claim 1, wherein the conductor and the insulating structure are detachably mounted.

19. The system of claim 1, wherein the vacuum chamber is part of a scanning electron microscope (SEM).

20. A feedthrough for providing an electrical connection between an inside and an outside of a vacuum chamber, the feedthrough comprising:
 a conductor;
 an insulating structure surrounding at least a portion of the conductor, wherein the insulating structure comprises quartz or glass; and
 an adhesion layer that attaches the conductor to the insulating structure in an airtight manner to enable the feedthrough to be used to provide an electrical connection between the inside and the outside of the vacuum chamber.

21. A feedthrough for providing an electrical connection between an inside and an outside of a vacuum chamber, the feedthrough comprising:
 a conductor;
 an insulating structure surrounding at least a portion of the conductor;
 an adhesion layer that attaches the conductor to the insulating structure in an airtight manner to enable the feedthrough to be used to provide an electrical connection between the inside and the outside of the vacuum chamber; and
 a bent portion comprised of at least one of the conductor, the insulating structure, or the adhesion layer.

* * * * *